United States Patent
Kaminer et al.

(10) Patent No.: US 10,170,272 B2
(45) Date of Patent: Jan. 1, 2019

(54) SYSTEM AND METHOD FOR USE IN ELECTRON MICROSCOPY

(71) Applicant: TECHNION RESEARCH & DEVELOPMENT FOUNDATION LIMITED, Haifa (IL)

(72) Inventors: Ido Kaminer, Haifa (IL); Maor Mutzafi, Haifa (IL); Gal Harari, Haifa (IL); Mordechay Segev, Haifa (IL)

(73) Assignee: Technion Research & Development Foundation Limited, Haifa (IL)

( * ) Notice: Subject to any disclaimer, the term of this patent is extended or adjusted under 35 U.S.C. 154(b) by 0 days.

(21) Appl. No.: 15/570,638

(22) PCT Filed: May 8, 2016

(86) PCT No.: PCT/IL2016/050485
§ 371 (c)(1),
(2) Date: Oct. 30, 2017

(87) PCT Pub. No.: WO2016/181385
PCT Pub. Date: Nov. 17, 2016

(65) Prior Publication Data
US 2018/0294136 A1 Oct. 11, 2018

Related U.S. Application Data

(60) Provisional application No. 62/158,591, filed on May 8, 2015.

(51) Int. Cl.
*H01J 37/153* (2006.01)
*H01J 37/26* (2006.01)

(52) U.S. Cl.
CPC ............. *H01J 37/153* (2013.01); *H01J 37/26* (2013.01); *H01J 2237/1538* (2013.01); *H01J 2237/2614* (2013.01)

(58) Field of Classification Search
CPC .. H01J 37/153; H01J 37/26; H01J 2237/1538; H01J 2237/2614
USPC .............................. 250/396 R, 396 ML, 505.1
See application file for complete search history.

(56) References Cited

PUBLICATIONS

Kaminer et al., Nonspreading Electron-Beams that Balance Self-Repulsion, CLEO:2013 Technical Digest © OSA 2013 (2 pages).
Mutzafi et al., Improving Electron Microscopy by Shaping the Electron Beam Wavefunction, CLEO:2015 © OSA 2015 (2 pages).
R. Erni, M. D. Rossell, C. Kisielowski, and U. Dahmen, "Atomic Resolution Imaging with a sub-50 pm Electron Probe", Phys. Rev. Lett. 102, 096101 (2009). (11 pages).
(Continued)

Primary Examiner — Nicole Ippolito
Assistant Examiner — Hanway Chang
(74) Attorney, Agent, or Firm — Roach Brown McCarthy & Gruber, P.C.; Kevin D. McCarthy

(57) ABSTRACT

An electron beam shaping unit for use in electron beam column and a method for designing thereof is presented. The electron beam shaping unit is configured for affecting electron beams of high density or strong electron-electron repulsion. These 5 beams can always be modeled with multi electron wave function. The electron beam shaping unit comprises a mask unit configured for affecting propagation of electrons therethrough to thereby form a propagating electron beam having, at far field, radial shape as determined by multi-electron non-linear function being an eigen function determined by a multi-electron Hartree-Fock Hamiltonian.

21 Claims, 12 Drawing Sheets

(56) References Cited

PUBLICATIONS

J. Verbeeck et al: "Production and application of electron vortex beams", Nature, vol. 467, No. 7313, pp. 301-304, Sep. 16, 2010. (4 pages).

R. Shiloh, Y. Lereah, Y. Lilach, and A. Arie, "Sculpturingtheelectronwavefunctionusingnanoscalephasemasks", Ultramicroscopy 144, 26 (2014). (6 pages).

N. Voloch-Bloch, Y. Lereah, Y. Lilach, A. Gover, and A. Arie, "Self accelerating electron Airy beams", Nature 494, 331 (2013). (8 pages).

V. Grillo, E. Karimi, G. C. Gazzadi, S. Frabboni, M. R. Dennis, and R. W. Boyd, "Generation of Nondiffracting Electron Bessel Beams", Phys. Rev. X 4, 011013 (2014). (7 pages).

Y. Zhu and H. Dürr, "The future of electron microscopy", Phys. Today 68, 32 (2015).(8 pages).

W. E. King, G. H. Campbell, A. Frank, B. Reed, J. F. Schmerge, B. J. Siwick, B. C. Stuart, and P. M. Weber, "Ultrafast electron microscopy in materials science, biology, and chemistry", J. Appl. Phys. 97, 111101 (2005). (28 pages).

A. H. Zewail, "Four-Dimensional Electron Microscopy", Science 328, 187 (2010). (8 pages).

E. Bauer, Surface Microscopy with Low Energy Electrons (Springer, 2014). (513 pages).

J. B. Hannon and R. M. Tromp, "Low-Energy Electronmicroscopy of Surface Phase Transitions", Annu. Rev. Mater. Res. 33, 263 (2003). (30 pages).

B. Barwick, D. J. Flannigan, and A. H. Zewail, "Photon-induced near-field electron microscopy", Nature 462, 902 (2009). (5 pages).

Mutzafi et al: "Non-linear shape preserving electron-beams", 2014 Conference of lasers and electro-optics (CLEO)—laser science to photonic applications, the optical society, Jun. 8, 2014, pp. 1-2 (2 pages).

McMorran et al: "Electron Vortex Beams with High Quanta of Orbital Angular Momentum", Science, vol. 331, No. 6014, Jan. 14, 2011, pp. 192-195 (4 pages).

Anonymous: "JSM-7800FPRIME Schottky Field Emission Scanning Electron Microscope, Products, JEOL Ltd." Jan. 1, 2016 (2 pages).

Masaya Uchida et al: "Generation of electron beams carrying orbital angular momentum", Nature, vol. 464, No. 7289, Apr. 1, 2010, pp. 737-739 (3 pages).

International Search Report for PCT/IL2016/050485, 2 pages, dated Aug. 17, 2016.

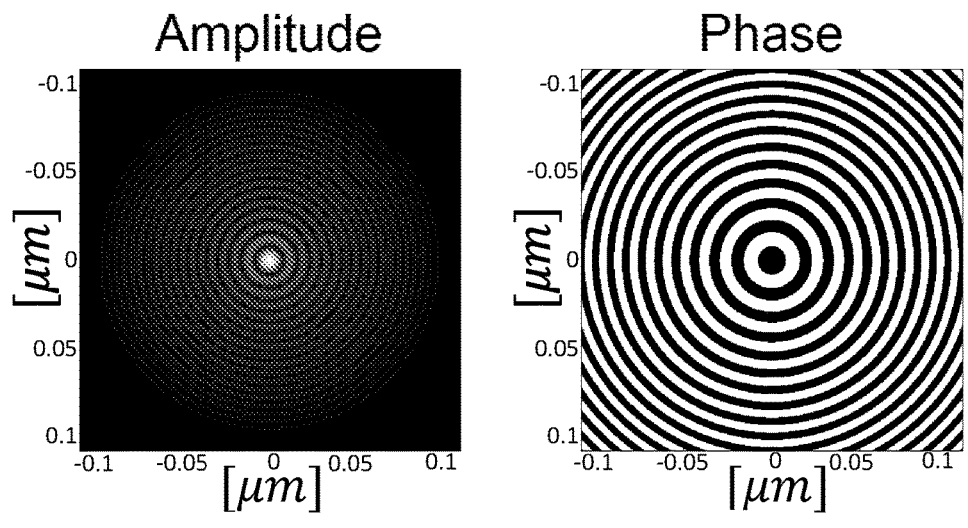
FIG. 3A  FIG. 3B
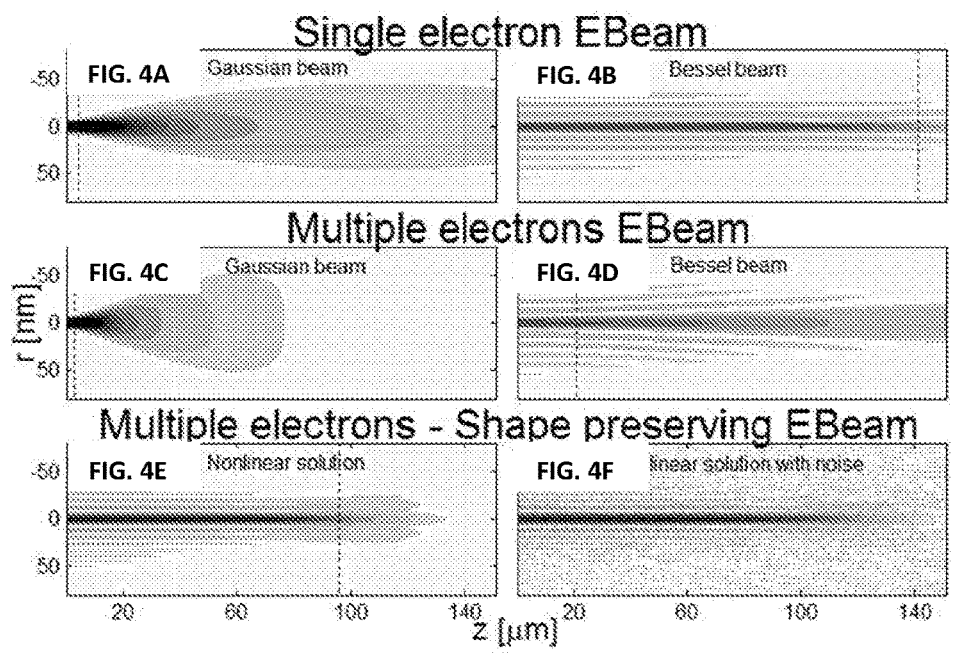

SYSTEM AND METHOD FOR USE IN ELECTRON MICROSCOPY

TECHNOLOGICAL FIELD

The present invention relates to system and methods for use in electron microscopy.

BACKGROUND ART

References considered to be relevant as background to the presently disclosed subject matter are listed below:
- R. Erni, M. D. Rossell, C. Kisielowski, and U. Dahmen, Phys. Rev. Lett. 102, 096101 (2009).
- J. Verbeeck, H. Tian, and P. Schattschneider, Nature 467, 301 (2010).
- R. Shiloh, Y. Lereah, Y. Lilach, and A. Arie, Ultramicroscopy 144, 26 (2014).
- N. Voloch-Bloch, Y. Lereah, Y. Lilach, A. Gover, and A. Arie, Nature 494, 331 (2013).
- V. Grillo, E. Karimi, G. C. Gazzadi, S. Frabboni, M. R. Dennis, and R. W. Boyd, Phys. Rev. X 4, 011013 (2014).
- Y. Zhu and H. Dürr, Phys. Today 68, 32 (2015).
- W. E. King, G. H. Campbell, A. Frank, B. Reed, J. F. Schmerge, B. J. Siwick, B. C. Stuart, and P. M. Weber, J. Appl. Phys. 97, 111101 (2005).
- A. H. Zewail, Science 328, 187 (2010).
- E. Bauer, *Surface Microscopy with Low Energy Electrons* (Springer, 2014).
- J. B. Hannon and R. M. Tromp, Annu. Rev. Mater. Res. 33, 263 (2003).
- B. Barwick, D. J. Flannigan, and A. H. Zewail, Nature 462, 902 (2009).

Acknowledgement of the above references herein is not to be inferred as meaning that these are in any way relevant to the patentability of the presently disclosed subject matter.

BACKGROUND

Electron microscopy has become a pivotal tool in numerous fields of study, such as electrical engineering, materials science and biology. Scanning Electron Microscopy (SEM) and Transmission Electron Microscopy (TEM) produce images of a sample by scanning it with a focused electron beam (e-beam) or launching the e-beam through the sample. The e-beam interacts with the sample and produces an image that contains spatial information about the sample. The fundamental limit on the highest resolution possible in electron microscopy, such as SEM and TEM, is the wavelength of the particle, which for electrons is on the order of pico-meters ($10^{-12}$ m). In practice, state-of-the-art electron microscopes are still about two orders of magnitude away from this fundamental limit.

GENERAL DESCRIPTION

There is thus a need in the art for a novel configuration of electron beam for use in electron microscopes. The technique of the present invention provides appropriate shaping of electron wave function to thereby enable maintaining a beam shape throughout propagation despite the inherent repulsion due to electric charges and diffraction effects.

The inventors of the present invention have identifies that electron-electron interaction (also referred to as the "space-charge" effect) might be considered, in some electron microscopes and applications, as a major reason preventing electron microscopes from reaching their fundamental resolution limit. For example this Limitation is highly relevant in ultra-fast, correlative, low energy, high current and other electron microscope application requiring high temporal and spatial resolutions. The electron charge (in addition to the fermion nature of the electrons) makes electrons repel one another, causing broadening of any e-beams made up of multiple electrons. This comes in addition to the so called natural broadening related to wave packets having finite size, and thus sets a limit on the spot size and therefore on the resolution of electron microscopy. Generally, when the density of the electron in the beam is sufficiently low, such electron-electron interaction is relatively negligible. However, operation of an electron microscope at such low current utilizing single electron beam or a very low density e-beam requires longer integration times in the detection process in order to obtain a reasonable signal to noise ratio (SNR). More specifically, operation in low currents reduces SNR or, when increased SNR is needed, sets a limit on the response time of electron microscopes. For example, when monitoring reaction or other time-dependent event/process, the temporal resolution of monitoring depends on the time required for an electron microscope for imaging of the sample with meaningful SNR. Alternatively, according to the present conventional techniques, when high SNR is desired together with relatively high response time, the use of multiple electrons propagating simultaneously along the beam causes broadening and reduces resolution.

The technique of the present invention is based on the inventors' understanding that the space-charge effect can be compensated by appropriately shaping of the electron beam. Such electron beam shaping allows electron microscopy systems to operate with relatively high intensity beams including multiple electrons while maintaining the same resolution of single electrons e-beams.

To this end the technique of the present invention utilizes formulation of multi electron wave equation (based on Schrodinger equation with Hartee-Fock approximation), designating parameters for desired beam with a number of electrons (typically corresponding to current), determining a structure of the electron beam cross-section and determining a corresponding mask structure for providing the desired electron beam structure. A mask designed according to the determined mask structure may then be placed in an electron beam shaping unit. The electron shaping unit is typically located in a path of electrons emerging from an electron gun and propagating towards a sample located on a sample holder of the electron microscope system.

The mask of the electron beam shaping unit is configured to apply appropriate pattern along a cross section of the propagating electron beam, thus shaping the electron beam that is typically produced as a plane wave beam (or, equivalently, a very wide Gaussian beam). Interaction between the electron beam and the beam shaping unit provides an appropriate wave-function that is formed at the far field, allowing focusing of electron beams carrying greater currents into a spot size that is generally associated with beam density of single electron. To this end the technique of the present invention and the beam shaping unit and mask of the invention provide a Multi Electron Non-Linear (MENL) beam having desired width for certain propagation length as described further below.

The mask may be designed as an intensity mask having, at least partially, blocking and transmitting regions, a phase mask, applying phase variation across the electron beam, or as phase and amplitude mask. Typically, the mask of the beam shaping unit may be configured as a binary mask including spaced apart blocking regions and transmitting regions arranged in a predetermined order to thereby provide the desired wave-function of the electron beam. Generally the mask configuration may be in the form of a Fourier Transform of the solution of the nonlinear Hartree-Fock based Hamiltonian, i.e. as Fourier transform of Eigen-function of the Hamiltonian as will be described in more details below.

Thus, according to a broad aspect of the present invention, there is provided an electron beam shaping unit for use in electron beam column, the electron beam shaping unit is configured for affecting multi electron wave function and comprising a mask unit configured for affecting propagation of electrons therethrough to thereby form at far field thereof a propagating electron beam having radial shape as determined by MENL function being an eigen function determined by a multi-electron Hartree-Fock Hamiltonian.

According to some embodiments, the mask may be configured as a binary mask having a plurality of spaced apart transmitting and blocking regions. According to some other embodiments, the mask may be configured as a phase and amplitude mask having a kinoform surface relief configuration.

The mask may typically be configured to generate electron beam having MENL wavefunction having zero or integer value of orbital angular momentum.

Generally, according to some embodiments of the invention, the mask may be configured to direct the electron beam having MENL wavefunction to a zero or first diffraction order.

Further, according to some embodiments of the invention, said MENL wavefunction corresponds to a solution of:

$$E\psi(r,t) = -\frac{\hbar^2}{2m}\nabla^2\psi(r,t) + \frac{\sigma Ne^2}{4\pi\varepsilon_0}\left(\int \frac{|\psi(r',t)|^2}{|r-r'|}d^3r'\right)\psi(r,t)$$

where $\psi(r,t)$ is the MENL wavefunction, E being energy eigenvalue of the wavefunction, $\hbar$ is Planck constant divided by $2\pi$, m is electron mass, $\varepsilon_0$ is dielectric constant of vacuum, e is electron charge, N is number of electrons in the beam, and $\sigma$ is the ratio of electrons having the same spin states (which is typically ½ for a random spin distribution).

According to one other broad aspect of the invention, there is provided a method for use in design of an electron beam column, the method comprising: providing data about desired electron beam parameters; determining corresponding parameters for a multi-electron Hamiltonian; determining an eigen function of said multi-electron Hamiltonian corresponding to the desired electron beam parameters; determining a transmission function providing said eigen function and determining structure of a mask having said transmission function when transmitting plane wave electron beam therethrough.

The multi-electron Hamiltonian may be a Hartree-Fock Hamiltonian.

Typically, the desired electron beam parameters may comprise data about electron beam energy and electron density within the beam.

According to some embodiments, the desired electron beam parameters may comprise data about acceleration voltage of the electrons and data about current on the electron beam column.

Typically, said determining an eigen function may comprise determining an MENL wave function having desired parameters in accordance with said electron beam parameters. The desired beam parameters may comprise orbital angular momentum value and data about energy of the electron beam.

According to some embodiments, said determining a transmission function may comprise determining a Fourier transform of the desire wavefunction. Further, said determining a transmission function may also comprise providing data about hologram plane wave to thereby direct the electron beam to the desire direction.

According to yet some embodiments of the invention, said determining structure of a mask may comprise thresholding of said transmission function in accordance with a predetermined threshold value such that where the transmission function value exceeds the threshold said mask having full transmission and where the transmission function is below the threshold the mask is configured for blocking transmission.

According to yet another broad aspect of the invention, there is provided an electron beam shaping unit for use in electron beam column, the beam shaping unit being characterized in the following:

said electron beam shaping unit being configured for affecting electron wave function passing; and said electron beam shaping unit being configured to affect said electron wave function passing therethrough to form a substantially not diverging multi-electron wave function.

According to a further broad aspect of the present invention, there is provided an electron microscope system, electron beam column or beam shaping unit. The beam shaping unit may be used in the beam column and/or the microscope system for shaping an electron beam in accordance with non-diverging wave-function configured for compensating for electron-electron electric interaction.

The beam shaping unit is characterized in the following:

(a) said electron beam shaping unit being configured for affecting phase and/or amplitude variations of electron wave function passing through while substantially not affecting probability distribution for said electron wave function at near field thereof; and (b) said electron beam shaping unit being configured to affect said phase and/or amplitude of electron wave function passing therethrough to form a substantially not diverging multi-electron wave function.

The beam shaping unit may comprise a mask being a phase only mask, amplitude mask, phase and amplitude mask or binary mask configured for affecting electrons passing therethrough to thereby generate an electron wavefunction in accordance with multi-electron propagation wave-function.

Generally, according to the present invention, the beam shaping unit maybe configured for generating electron beam capable of carrying increased current while maintaining spot size of 1 to 50 nanometers and while propagating along at least 100 micrometer. In some embodiments the spot size may be between 0.1 and 5 nanometers for propagation distance of about 1 micrometer. The electron beam may carry current and energy values corresponding to two or more electrons located simultaneously between the beam shaping unit and a sample to be inspected while eliminating divergence of the beam generated from interaction between said two or more electrons.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIGS. 3A-3B show numerical simulation of an electron wave-function according to the technique of the present invention, FIG. 3A shows amplitude variation and FIG. 3B shows phase variation across cross-section of the electron beam;

FIGS. 4A to 4F show simulation of beam propagation for single electron beam having Gaussian shape (FIG. 4A) and Bessel shape (FIG. 4B) and multi electron beams having Gaussian shape (FIG. 4C) Bessel shape (FIG. 4D) and MENL beam shape without noise (FIG. 4E) and with noise (FIG. 4F);

DETAILED DESCRIPTION OF EMBODIMENTS

Figure 1:
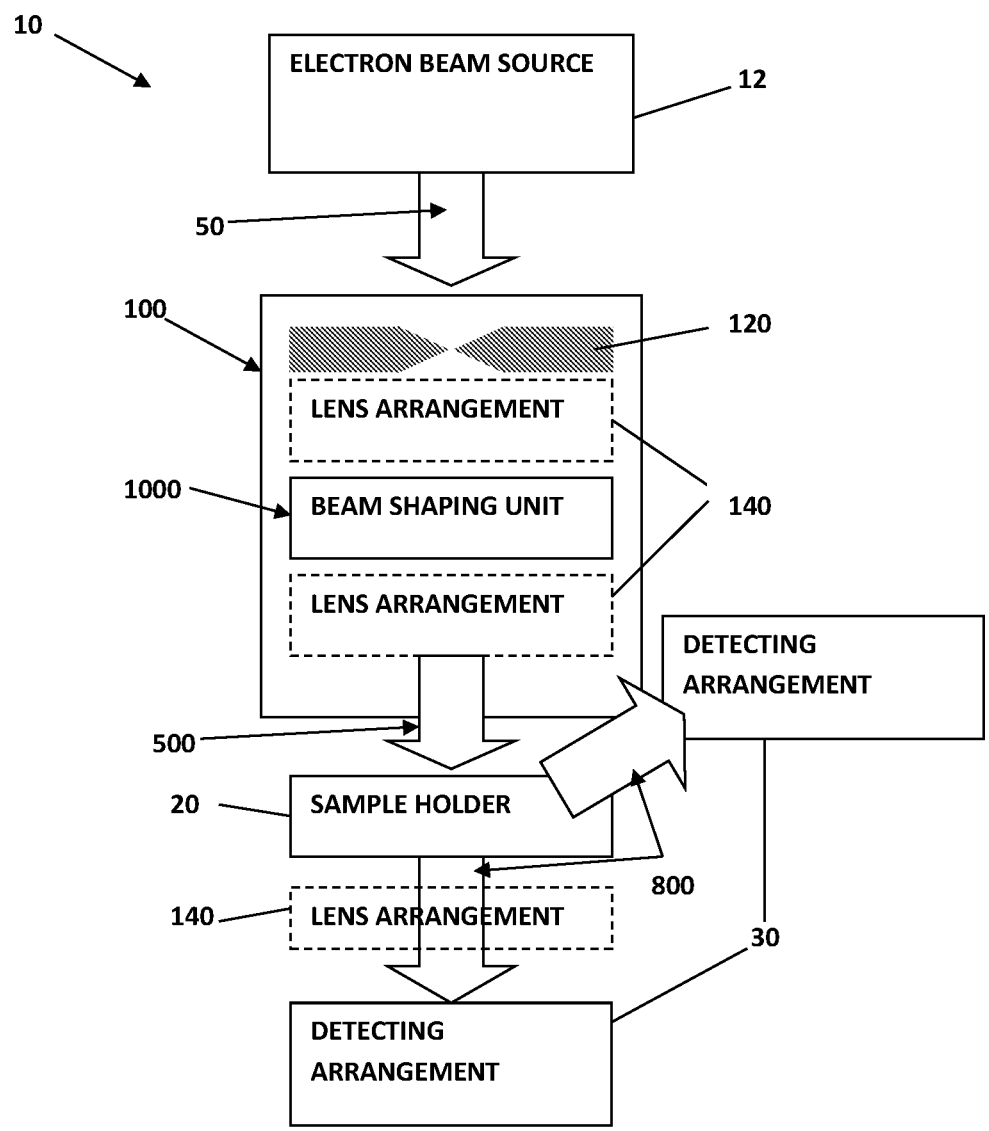
FIG. 1 schematically illustrates an electron microscope configured according to embodiments of the present invention.

Reference is made to FIG. 1 illustrating a schematic configuration of an electron microscope system 10. The electron microscope 10 configured according to the present invention as descried further below may be a Transmission Electron Microscope (TEM) or a Scanning Electron Microscope (SEM). The electron microscope system 10 may generally include an electron gun (electron beam source) 12 configured to generate and electron beam 50 of desired electron density and energy. The generated electron beam is transmitted towards an electron beam column 100 configured for shaping and directing the electron beam. The electron beam column may generally include one or more magnetic lens arrangements 140, one or more acceleration/deceleration electrode arrangement 120 and includes at least one beam shaping unit 1000 configured to apply predetermined shaping onto the electron beam to thereby cause the electron beam to propagate with certain desired wavefunction. The beam shaping unit 1000 may generally include a mask configured to affect electron propagation there through to force the electrons to propagate with the desired wave function. The mask unit of the beam shaping unit 1000 may be configured to apply intensity and/or phase patterns to the electron beam to thereby cause the electron beam to propagate at far field based on the desired wave function. The pattern of the mask is selected in accordance with Fourier transform of a desired radial shape of the electron beam provided based of multi-electron nonlinear Hartee-Fock Hamiltonian.

The resulting electron beam 500 emerges from the beam column 100 and is directed towards a sample located on a sample holder 20. Electron beam 500 according to the present invention is typically configured as a substantially non diverging beam while supporting greater currents corresponding to single electron beam. More specifically, the electron beam is formed of a main lobe having substantially non diverging shape (width) surrounded by plurality of side lobes as will be described further below. It should however be noted that according to some embodiments, the main lobe may or may not be associated with zero order of diffraction and may actually be associated with a lobe of first diffraction order. The selected lobe of the wave-function generated according to the present invention substantially maintains its structure for a certain propagation distance. Thus the probability that electrons will be detected within the lobe for longer propagation time and distance is increased as compared with the conventional techniques. This is while enabling higher currents corresponding to several electrons traveling within propagation path of the electron beam.

While operation of the electron beam (e.g. as an electron microscope) the beam is typically focused onto the sample to provide desirably small spot size in nanometric regime and typically with spot size (associated with cross-section of the selected/main lobe) width between 0.1 and 40 nanometer, or generally between 0.1 and 5 nanometer or between 5 and 40 nanometer. Interaction of the electron beam with the sample may result in scattering or transmitted electrons, electromagnetic radiation and/or secondary electrons emitted from the sample. The output radiation 800 may be detected by a detection unit 30 configured for detecting transmitted electrons or other scattered radiation (electrons or electromagnetic radiation) in accordance with the design of the electron microscope.

Thus, the electron beam mask design and the beam shaping resulting therefrom according to the present invention provide an electron beam having a substantially non-diverging cross section for current values corresponding to electron density of plurality of electron. This is contrary to the previously known beam shaping techniques providing Gaussian- or Bessel-shape electron beam, which provide low divergence for single electron but undergo divergence when applied to electron beam carrying more than a single electron at a time.

To this end the beam shaping unit 1000 may include an appropriately made mask configured for affecting electron beam passing therethrough and shaping the electron beam in accordance with multi-electron wave-function (MENL). The mask may be configured as a phase-only mask, phase and amplitude mask, amplitude/intensity only mask as well as binary mask including spaced apart blocking and transmitting regions. For example, the mask may be configured of a metal plate having spaced apart transmitting region (holes in the plate) separated by blocking regions of the mask. Additionally or alternatively, the mask may be configured as kinoform mask carrying a patterned surface (surface relief) configured to apply the desired phase variation. Alternatively or additionally, the beam shaping unit 1000 may be configured with one or more electromagnetic field generators configured to provide the desired shaping as described further below.

Figure 2:
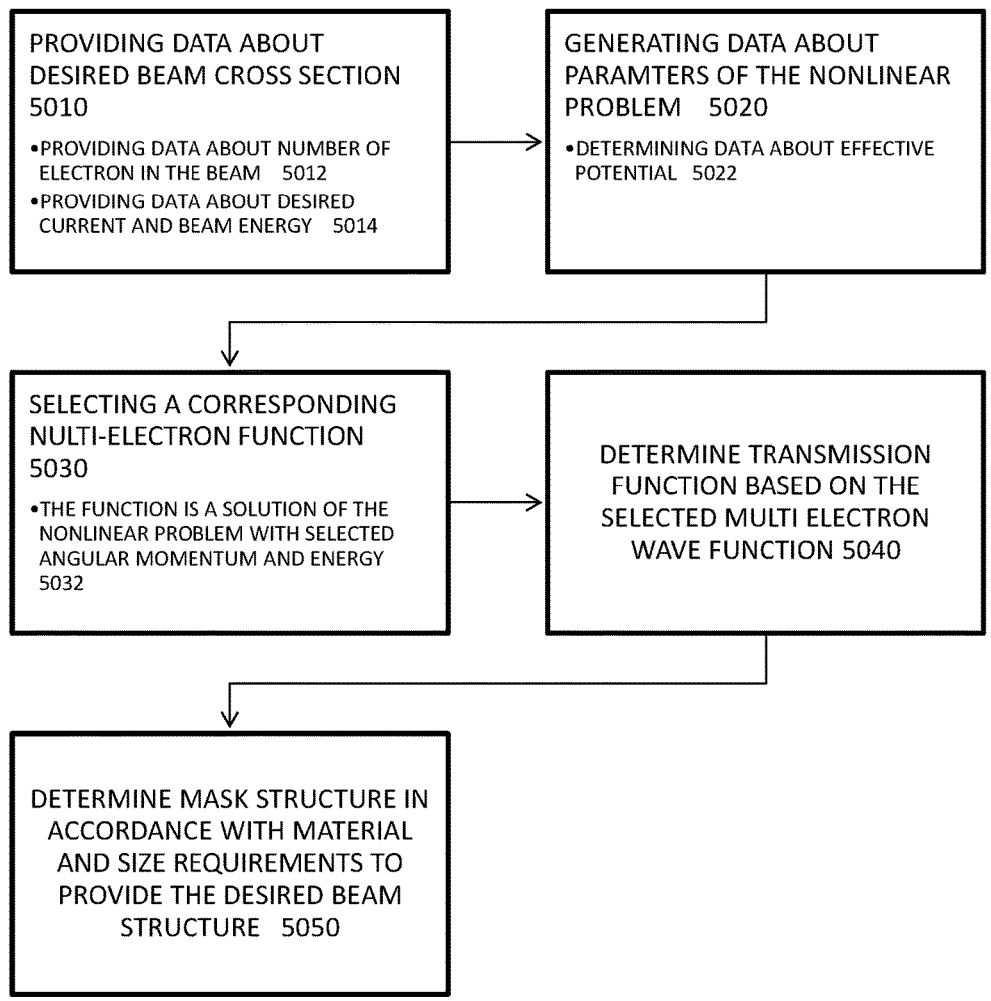
FIG. 2 shows schematically a method for use in design of an electron beam shaping unit according to some embodiments of the invention.

Reference is made to FIG. 2 generally illustrating a technique for use on design of an electron beam shaping makes according to the present invention. It should be noted that the operation of the technique may replace order of process actions in accordance with provided and/or desired data about the electron beam. To determined parameters of the desired MENL wave function for the electron beam, data about the electron microscope, or any other electron beam unit, is provided 5010. This data may generally include data about reachable and/or desired beam current and voltage. This data may indicate electron density and number of electrons in the beam 5012 and/or data about the current and energy of the beam 5014. Using the beam parameter, data about the nonlinear problem as defined by the Hartree-Fock Hamiltonian, and will be described in more details further below, is determined 5020. The set of equations include numerical parameters as well as effective potential U associated with the MENL wavefunction 5022.

The nonlinear problem defined by the Hertree-Fock Hamiltonian is typically described, and numerical solutions thereof may be obtained numerically. The MENL wavefunction is a well-defined function having functional structure but no simple analytic representation. As described in more details further below, there are many MENL solutions corresponding to different energy levels and to orbital angular momentum of the electron beam. Based on the above determined parameters of beam current and voltage (electron density and energy), as well as orbital angular momentum, a MENL function is selected 5030. As described, the selected function is a solution of the nonlinear problem with selected angular momentum, energy and electron density 5032.

In accordance with the selected MENL wavefunction, a transmission function is determined 5040. The transmission function is typically a Fourier transform of the selected MENL function, and may also include a varying phase determined to shift the desired wave function to the zero of first diffraction orders. Based on the determined transmission function, the mask structure can be designed 5050. The mask structure may be binary, phase mask and or phase and amplitude mask. Typically the mask is designed such that at far field, where evanescent waves are exponentially low, the resulting electron beam assumes the selected MENL wave-function.

To design the desired electron beam, or generally the cross section of a propagating wave-function, the inventors have developed a novel quantum-based technique for reducing limitations due to electron-electron interaction and allow the use of high density, high resolution e-beams. Shaping techniques of the quantum wave-function of electron beams, show great potential for improving the performance of traditional electron microscopes. However, thus far the existing techniques have been used only for low density e-beams (assuming a single electron), due to the space-charge effect. It should be noted that high intensity electron beams may be used in various additional fields other than microscopy. Such applications include electron accelerators, high-flux electron microscopy with short integration time, electron lithography, high intensity X-ray sources (e.g., FEL) and many more.

Thus, the technique of the invention utilizes shaping of the electron beam wave-function so as to compensate for the repulsion between electrons. This enables the use of beams made up of multiple electrons without compromising on the spatial resolution. Additionally, such beam shaping of the electron beam reduces divergence of the electron beam thereby providing prolonged depth of focus of a dense e-beam.

It should be noted that the use of multi-electron beam, or increased intensity (current) electron beam enables achieving higher signal to noise ratio (SNR) for a given integration time. Alternatively, the use of such increased intensity may be used to decrease the required integration time with respect to the conventional existing method and thereby enable inspection of fast occurring processes. This is while not reducing, and possibly increasing, the spatial resolution provided by the beam-spot of the multi-electron beam with respect to the existing single-electron beam.

To this end, the technique of the present invention is based on the inventors' understanding of the following. It is known that the quantum state of the electron-beam is formally anti-symmetric to exchange between electrons (due to Pauli's Exclusion Principle). Even relativistic electrons (such as accelerated electrons in an electron beam for use in electron microscopy) can still be described with Schrödinger's Equation, with a modified mass. The electron beam wave-function can be described based on Hartree-Fock approximation in cylindrical coordinates as:

$$\psi(\vec{r}, t) = \frac{1}{a_0} \varphi(\rho) e^{il\theta} \frac{e^{ik_z z}}{\sqrt{L}} e^{-i\omega t} \qquad \text{(equation 1)}$$

where, ψ denotes a single electron wave-function applicable to each of the electrons in the e-beam, l is the orbital angular momentum (OAM) number, $k_z$ is the wavevector in the z direction, $a_0$ is Bohr's radius and L is the uncertainty in z. In this connection it should be noted that different electrons may occupy the same ρ spatial state while having a different phase in z and t without occupying the same state. The radial part φ(ρ) can be determined by substituting this wavefunction into the Hartree-Fock Hamiltonian and determining the eigen functions, i.e., the time-independent spatial wavefunction:

$$-i\hbar \partial_t \psi(r, t) = \qquad \text{(equation 2)}$$
$$-\frac{\hbar^2}{2m} \nabla^2 \psi(r, t) + \frac{\sigma N e^2}{4\pi\varepsilon_0} \left( \int \frac{|\psi(r', t)|^2}{|r - r'|} d^3 r' \right) \psi(r, t)$$

where ψ is the single electron wave-function of equation 1, N is the number of electrons in the beam and $\vec{r}$ is a location vector, e is the electron charge, $\varepsilon_0$ is dielectric constant of vacuum, and σ is the ratio of electrons having the same spin states (which is typically ½ for a random spin distribution). According to the technique of the invention, the wavefunction is selected to be substantially time harmonic. Therefore equation 2 can be presented as:

$$E\psi(r, t) = -\frac{\hbar^2}{2m}\nabla^2 \psi(r, t) + \frac{\sigma Ne^2}{4\pi\varepsilon_0}\left(\int \frac{|\psi(r', t)|^2}{|r - r'|}d^3r'\right)\psi(r, t) \quad \text{(equation 3)}$$

As can be seen, the resulting approximation is a non-linear equation including interaction between electrons. Defining the effective potential $$U(\vec{r}, t) = Na_0 \int \frac{|\psi(\vec{r}', t)|^2}{|\vec{r}' - \vec{r}|} d\vec{r}'$$

where $a_0$ is the Bohr radius $$\left(a_0 = \frac{4\pi\varepsilon_0 \hbar^2}{me^2}\right)$$

and rearranging, leads to:

$$\left(\partial_{\rho\rho} + \frac{\partial_\rho}{\rho}\right)U(\rho) = -\frac{4\pi n}{a_0}|\varphi(\rho)|^2 \quad \& \quad \text{(equation 4)}$$

$$\left(\partial_{\rho\rho} + \frac{\partial_\rho}{\rho} - \frac{l^2}{\rho^2}\right)\varphi(\rho) = \frac{1}{a_0^2}U(\rho)\varphi(\rho).$$

Here, n is the density of electron per unit length in z, which depends linearly on the e-beam current. More specifically, $$n = \sqrt{\frac{m}{2e^3}}\frac{I}{\sqrt{V}}$$

the electron density corresponds to the beam current and the accelerating potential, where the accelerating potential also corresponds to the eigen value of the wavefunction E providing $$n = \sqrt{\frac{m}{2e^2}}\frac{I}{E}.$$

The nonlinear set of equations is solved numerically based on predetermined initial conditions, to provide a set of functions providing suitable cross sectional structure of the non-diverging electron beam. In this connection the following should be noted. Being a result of a set of nonlinear differential equations, the family of resulting multi-electron radial functions does not have an analytical formulation. However, similar to other well-known functions, e.g. Bessel functions etc., the resulting eigen-function of equation 4 are well described function defined on the domain of real non-negative numbers and providing a measure for the amplitude of the multi-electron wavefunction at the corresponding radial distance from central axis of the beam. The function family $\varphi_E(\rho)$ provide that integral of $\varphi_E(\rho)$ is finite and corresponds to the number of electrons N propagating simultaneously within the beam. To enhance understanding, functions selected from the function family $\varphi_E(\rho)$ characterized as corresponding to eigen-function of equation 3 and 4 and specific wave function selected therefore are referred herein as multi-electron nonlinear (MENL) function.

$$\int 2\pi\varphi_{N,E}(\rho)\rho d\rho \propto 1 \quad \text{(equation 5)}$$

Further in accordance with the formulation of equation 4 above, electronic wave function having such cross-section part of the function propagated while substantially not diverging and thus allowing the use of multi-electron focused electron beam.

Figure 5A:
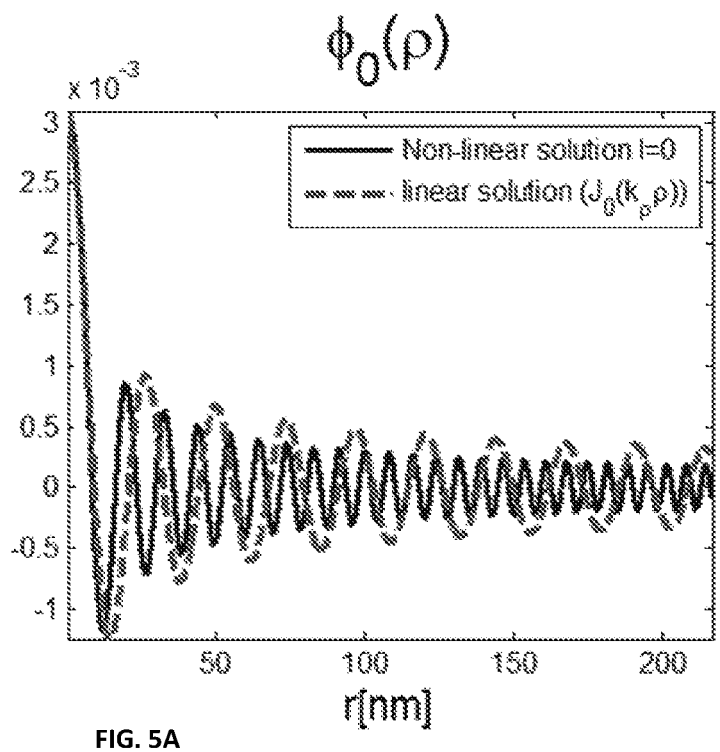
FIGS. 5A to 5C show alternating structure of a wave-function according to the technique of the present invention along the cross section diameter of the wave-function compare to Bessel function.
Figure 5B:
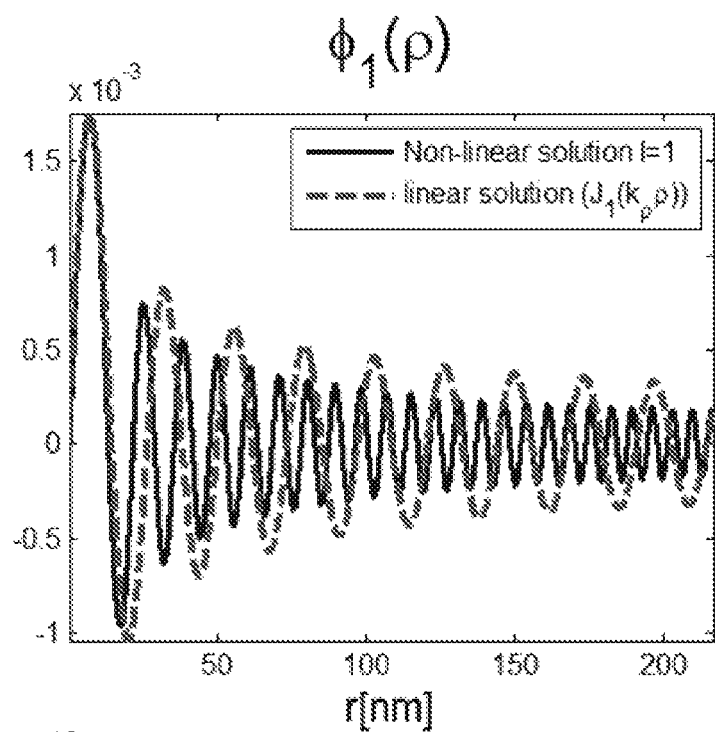
Figure 5C:
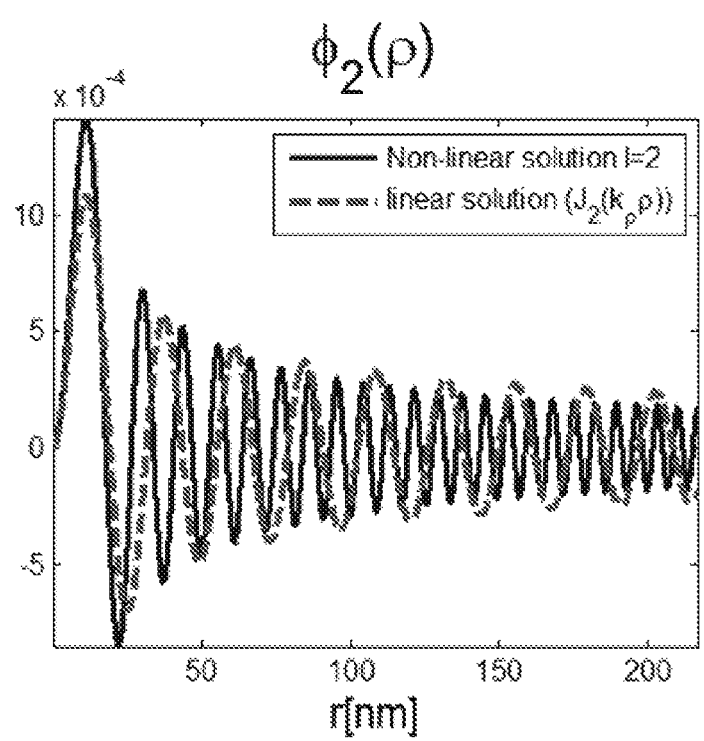

In this connection, reference is made to FIGS. 3A to 3B, FIGS. 4A to 4F and FIGS. 5A to 5C showing diagrams describing structure of the multi-electron wavefunction selected according to the technique of the invention as compared to the conventionally used Bessel and Gaussian structure electron beams. FIG. 3A shows cross section amplitude and FIG. 3B shows cross section phase. FIGS. 4A to 4F shows propagation simulation of single electron Gaussian beam (FIG. 4A) and Bessel beam (FIG. 4B), multi electron Gaussian beam (FIG. 4C) and Bessel beam (FIG. 4D) and multi electron beam structure according to the present invention in noise free environment (FIG. 4E) and with noise (FIG. 4F). The beam configuration exemplified in these figures corresponds to the solution having minimal energy and zero orbital angular momentum. FIGS. 5A to 5C show the radial part $\varphi(\rho)$ for orbital angular momentum values of zero (FIG. 5A), 1 (FIG. 5B) and 2 (FIG. 5C), as compared to the corresponding Bessel function. These numerical values of the eigen-functions are truncated (i.e., the electron wave-function is truncated) to provide realistic results for the electron wave-function. The wave propagation simulation in FIGS. 4A to 4F relates to high electron current of 100 μA at acceleration voltage of 20 KV corresponding to electron density n of the about $7.44 \times 10^6$ electrons per meter. Such high current relates to multi-electron beam configuration, which will result in broadening of the electron beam in the conventional known beam shapes. As can be seen from FIGS. 3A and 3B, the wave-function has a main lobe having the main portion of probability distribution for electron location, and plurality of alternating lobes around it. Further as can be seen of FIGS. 4E and 4F, the main lobe maintains most of its energy/electron density while propagating up to certain propagation distance of about 100 micrometer when the beam diverges. It should be noted that corresponding multi-electron beams having Bessel or Gaussian structure diverge at much shorter distances of around 20 micrometer as shown in FIGS. 4C and 4D.

FIGS. 5A to 5C illustrate structure of the radial part of the electron wave function, determined numerically in accordance equation 2 above as compared to the commonly used solution of the Bessel function for orbital angular momentum values of 0 (zero), 1 and 2. As can be seen, the structure of functions is substantially similar at low values of $\rho$; however the periodicity of oscillation between positive and negative phase is higher indicating that greater energy is directed towards the main axis of propagation defined by $\rho=0$. This allows further pulling of the probability distribution of the electron wave-function towards the main lobe and maintaining the beam spot size. It should also be noted, and can be generally seen from these figures, that the MENL function according to the present technique is a continuous function that is differentiable and integrable between $\rho=0$ substantially to $\rho=\infty$.

Figure 6:
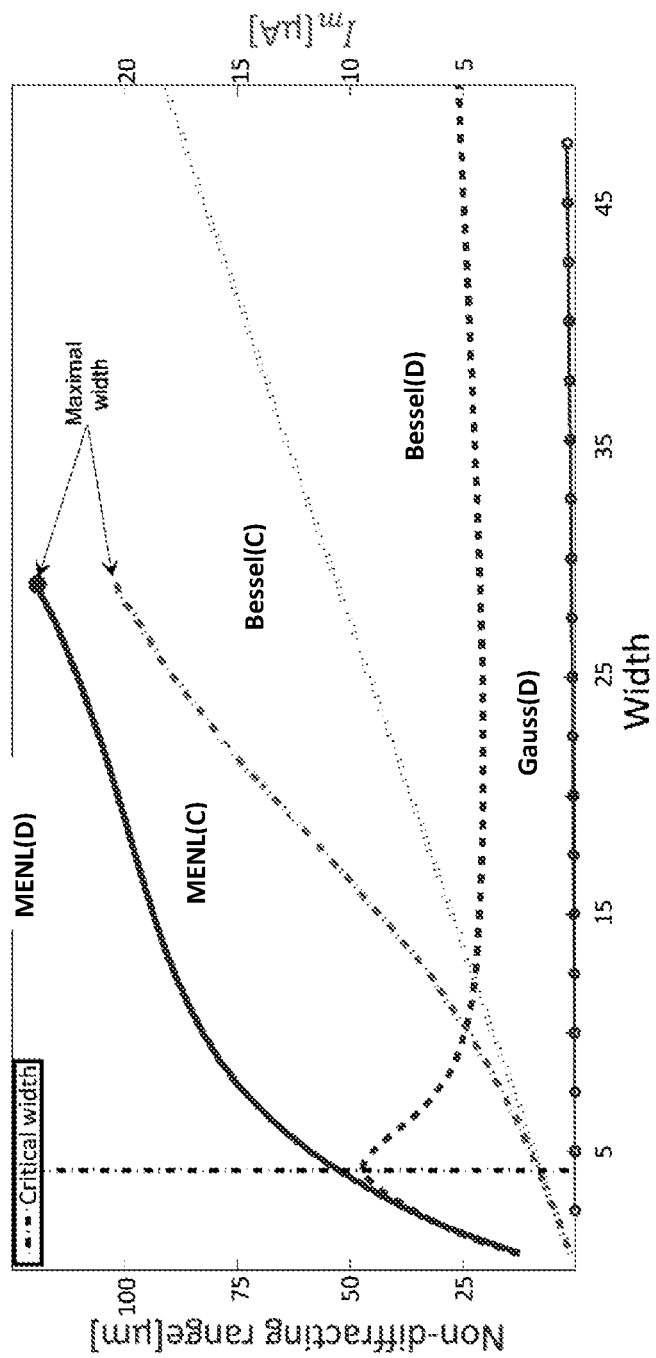
FIG. 6 shows a numerical comparison between depth-width behavior of the electron beam according to the present invention with known configurations of electron beams.

FIG. 6 illustrates a comparison of penetration depth and corresponding width-preservation for the main types of electron beam as conventionally known (Bessel and Gassian beams) with respect to the MENL wave-function according to the technique of the present invention (MENL). The graph shows relations between penetration depth of the wave-function (range of propagation where the function maintains width), spatial width of the main lobe (marked as (D)), and amount of current carried by the main lobe (C) of the wave-function of a certain width. In this figure, the different wave-functions are simulated with initial total current of I=100 µA. A unique property of the MENL function having non-linear shape preserving solution is that its resolution is bounded from above. More specifically, the main lobe of the wave function does not increase in diameter with propagation and that the maximal width is determined by the current provided. This upper limit occurs because the interference of the shaped wave function balances the beam self-repulsion and diffraction only up to a certain threshold. Above this threshold the beam spreading is too strong and repulsion and diffraction effects cause the beam to spread and the main lobe is no longer maintained. As can also be seen in the figure, the wave-function according to the present invention maintains the initial width while propagating, and additionally it maintains the current density within the main lobe, thereby enabling greater sensitivity in inspection by eliminating or at least significantly reducing losses in signal intensity due to the distance the beam propagated towards the sample.

Figure 7:
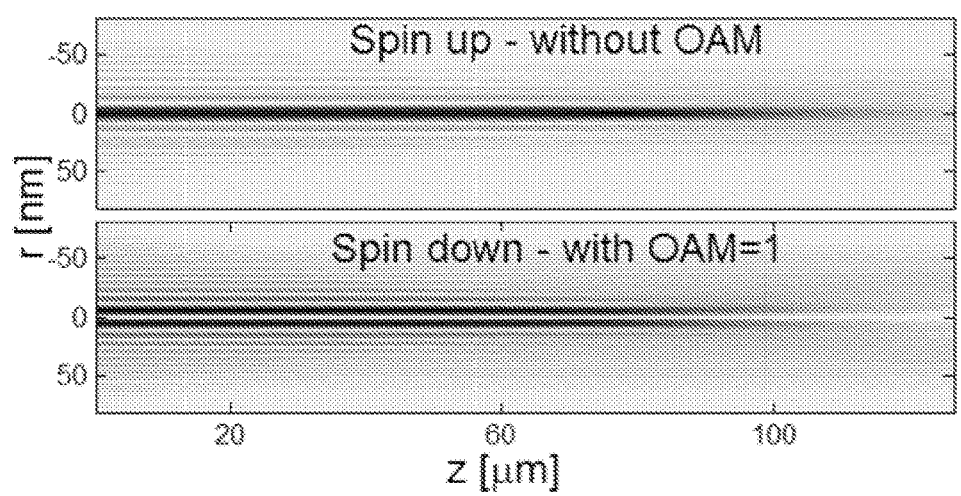
FIG. 7 shows numerical simulations of beam propagation of a configuration of two MENL electron beams, according to the present invention, one having zero orbital angular momentum and the second having orbital angular momentum of one.

Reference is made to FIG. 7 showing numerical simulation of beam propagation for multi electron MENL beam shaped according to the present invention for a beam consisting of spin up electrons and having orbital angular momentum (OAM) zero and beam propagation of electron beam consisting of spin down electron and having OAM of one. In this connection utilizing an electron beam where half the electrons have spin up and zero OAM and half have spin down and OAM=1 may provide further increase resolution and beam preservation, the depth of focus (range of shape-invariant propagation) may generally be enhanced by an additional 20% on top of the enhancement resulting from the use of the technique of the invention. It should be noted that providing an electron beam including additional electrons having different eigen-solutions of equation 4 may further improve the shape preservation and reduce the spot size (increase resolution) of the electron beam. Further it should be noted that the use of electron beam carrying electrons with certain non-zero orbital angular momentum may be used for various application such as electron energy-loss spectroscopy (EELS), where excitation of quantum state within a sample requires transfer of angular momentum as well as energy.

Thus, the technique of the invention is based on the inventors' understanding that an electron beam having radial structure according to MENL function having suitable energy and orbital angular momentum provides a substantially non diverging beam for a predetermined propagation distance, which greatly exceeds that of the conventionally known Bessel shaped electron beam. To this end the technique of the invention generally includes selecting an appropriate MENL function having suitable electron density and angular momentum; determining a mask structure such that transmitting plane wave electron beam through the mask will result in an electron beam shaped according to the selected MENL function.

Figure 8A:
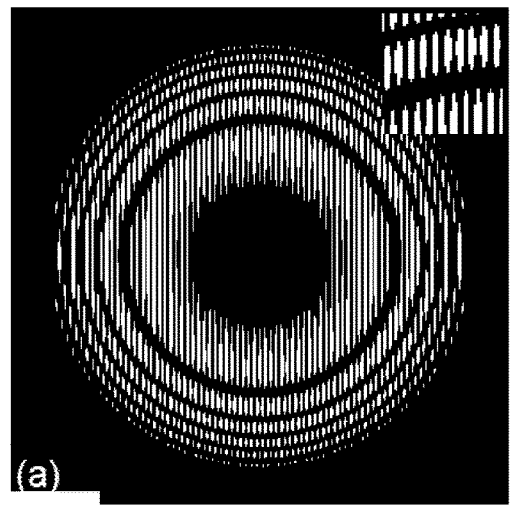
FIGS. 8A to 8D show binary mask structure for electron beam with orbital angular momentum of zero (FIG. 8A), first two diffraction order of electron beam generated by the binary mask (FIG. 8B), cross section of the corresponding MENL function shape (FIG. 8C) and simulated cross section of the resulting electron beam of the first diffraction order (FIG. 8D)
Figure 8B:
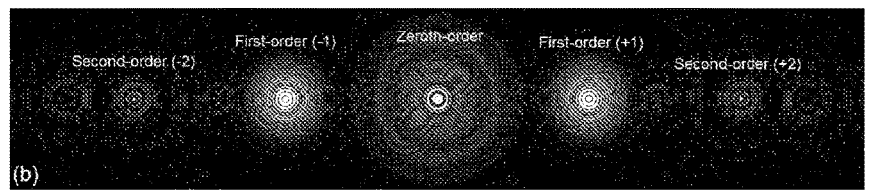
Figure 8C:
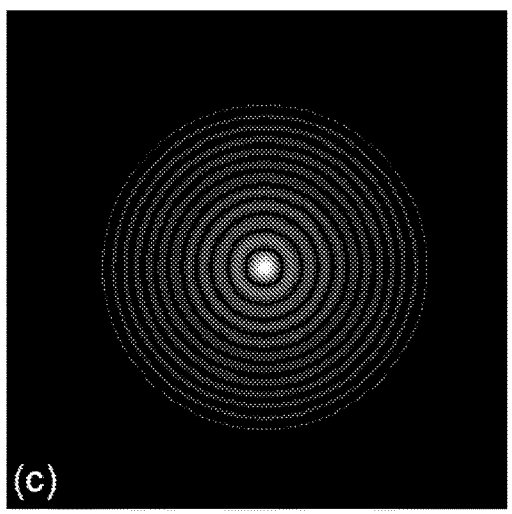
Figure 8D:
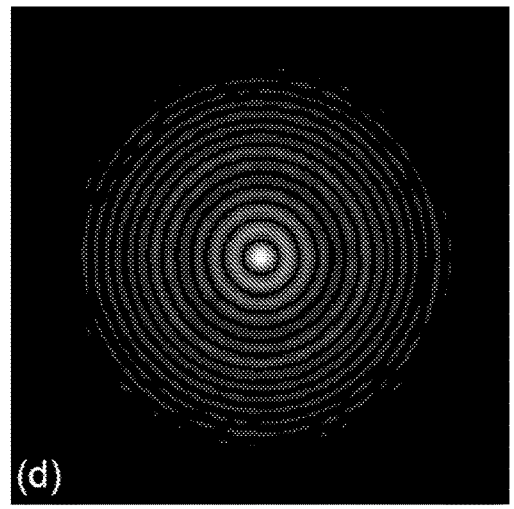
Figure 9A:
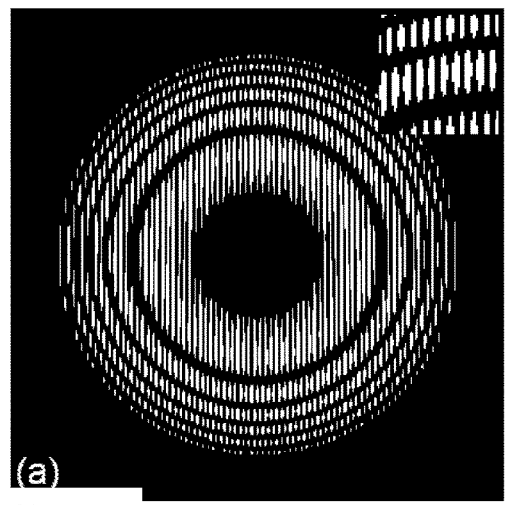
FIGS. 9A to 9D show binary mask structure for electron beam with orbital angular momentum of one (FIG. 9A), first two diffraction order of electron beam generated by the binary mask (FIG. 9B), cross section of the corresponding MENL function shape (FIG. 9C) and simulated cross section of the resulting electron beam of the first diffraction order (FIG. 9D)
Figure 9B:
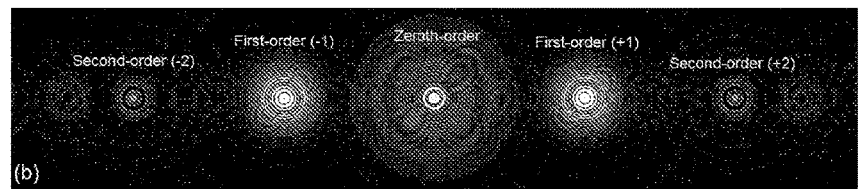
Figure 9C:
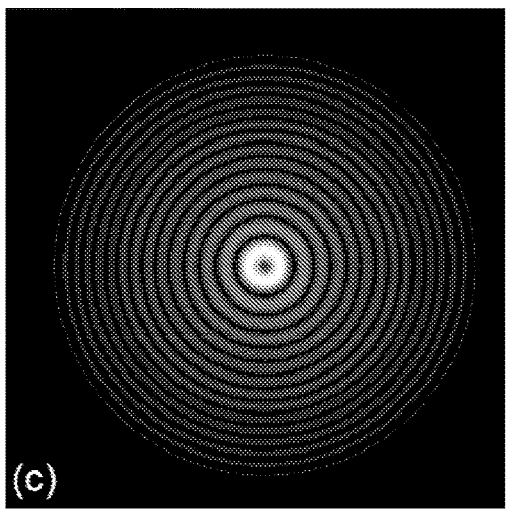
Figure 9D:
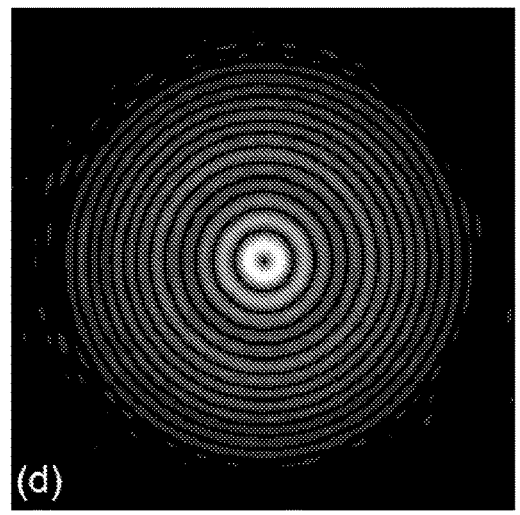

According to some embodiments of the invention, the mask may be configured to direct electrons transmitted therethrough by diffraction into a plurality of diffraction orders. This may be used to provide higher ratio of the electron beam intensity within the desired beam shape and reducing noise factors. In a similar manner, the mask configuration according to the present invention may be designed to direct electron beam into several diffraction orders, where the desired MENL electron beam is directed to the zero or first order of diffraction. In this connection, reference is made to FIGS. 8A to 8D and FIGS. 9A to 9D showing mask configuration for generating MENL electron beam having zero OAM (FIG. 8A) and OAM=1 (FIG. 9A); first two diffraction orders of the resulting electron beam determined by simulation as generated by the mask (FIG. 8B and FIG. 9B); cross section of the corresponding desired MENL function (FIG. 8C and FIG. 9C); and simulated cross-section of the generated electron beam (FIG. 8D and FIG. 9D).

The mask structure is determined based on well-known wave propagation theory to provide transmission of electrons therethrough and direct the electrons to form the desired MENL beam structure at far field. In this connection the term far field should be understood as relating to a distance from the mask where evanescent waves are exponentially small and the detected data corresponds to the propagating waves. Thus according to some embodiments of the invention, the mask structure may be determined in accordance with a Fourier transform of the desired MENL function.

The non-diffracting wavefunction (the solutions of Eqs. 4) can be generated by passing the electron beam (or generally plane wave beam of any charged particle) through a binary holographic mask, or through a phase mask configured to imprint the actual phase distribution of the shape-invariant wavefunction, which shapes the electron wavepacket directly. Generally, to design the holographic mask a transmission function of the mask is determine in accordance with the desired MENL function:

$$T_{holographic\ mask} = |\mathcal{F}\{\varphi(\rho)e^{il\theta}\} + e^{ik_h\rho\ \cos\theta}|^2 \quad \text{(equation 6)}$$

where $\varphi(\rho)e^{il\theta}$ is the radial and angular parts of the selected MENL function being a solution of equation 4 above; the symbol $\mathcal{F}$ stands for Fourier transform; and $e^{ik_h\rho\ \cos\theta}$ is a plane wave acting as a reference for the hologram. Based on the determined transmission function, the holographic mask can be designed. Further, as indicated above, to provide simple structure of the electron beam shaping mask, and to enable mask production using relatively simple and low cost materials, it may be configured as a binary mask. Such a mask can be created by having an arrangement of transmitting and blocking regions configured such that electrons transmission through the mask provides an MENL shaped electron beam. The binary mask may be configured based on certain maximal radial distance (size of the mask) and a threshold of minimal value of the transmission function. For example, the binary mask may be configured as having transmission as follows:

$$T_{holographic\ mask}^{binary} = \begin{cases} 1, & T_{holography} > \text{threshold and } \rho < \rho_{max} \\ 0, & \text{else} \end{cases} \quad \text{(equation 7)}$$

The threshold may be selected in accordance with material properties of the mask and desired electron beam intensity (current). As described above, two such mask designs are exemplified in FIG. 8A and FIG. 9A corresponding to zero OAM (l=0 in equation 6) and OAM=1 (l=1 in equation 6). The corresponding MENL wavefunction are the first diffraction order (and the −1 diffraction order being the complex conjugate thereof) in FIG. 8B and FIG. 9B. The cross sections of the wave function shown in FIG. 8D and FIG. 9D show very good agreement the mathematical representation of the MENL functions shown in FIG. 8C and FIG. 9C.

Figure 10A:
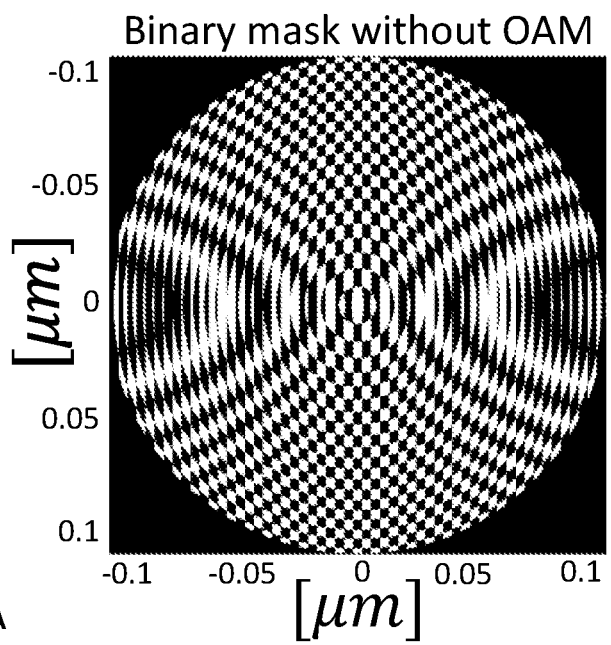
FIGS. 10A and 10B exemplify two phase pattern configurations configured for electron beam shaping according to the present invention configured to direct the electron beam to the zero diffraction order.
Figure 10B:
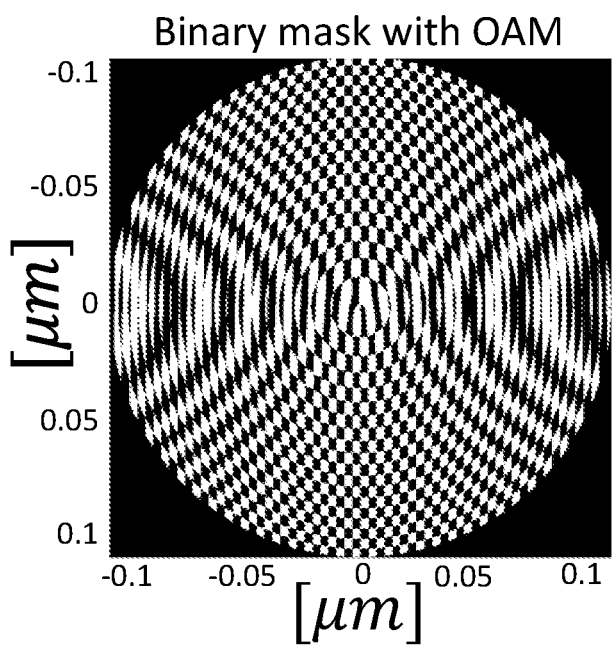
Figure 11A:
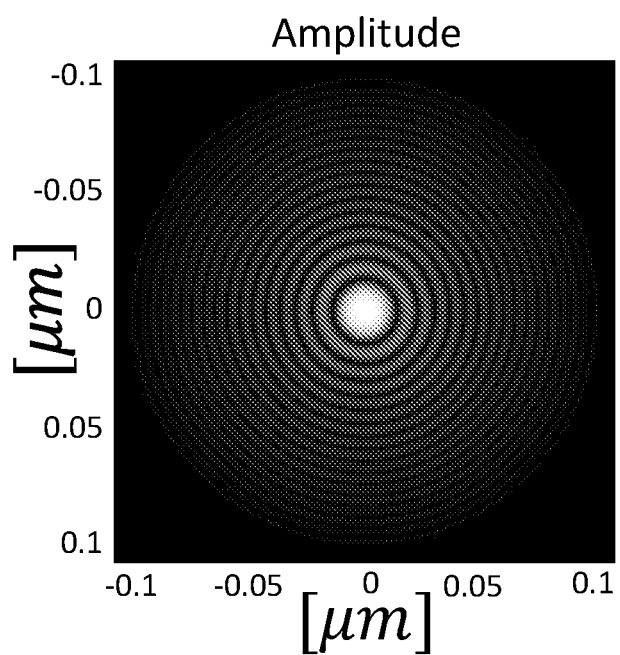
FIGS. 11A to 11D show amplitude (FIGS. 11A and 11C) and phase (FIGS. 11B and 11D) maps of electron wave-functions having zero (FIGS. 11A and 11B) and one (FIGS. 11C and 11D) orbital angular momentum.
Figure 11B:
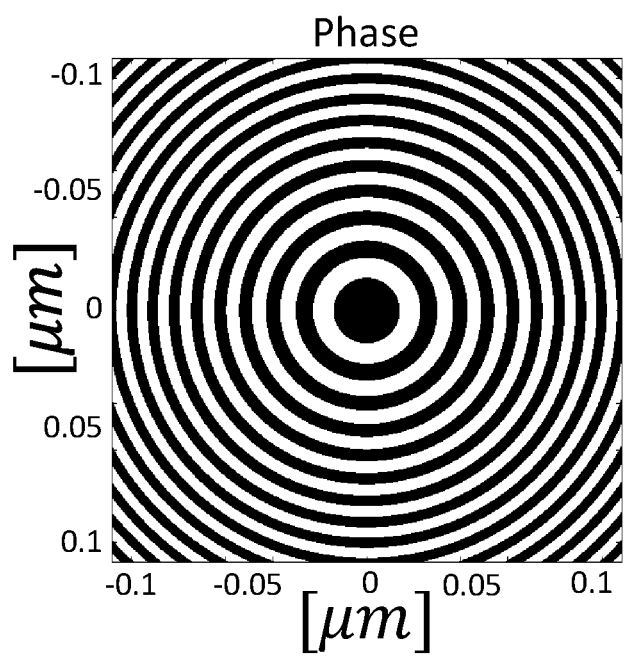
Figure 11C:
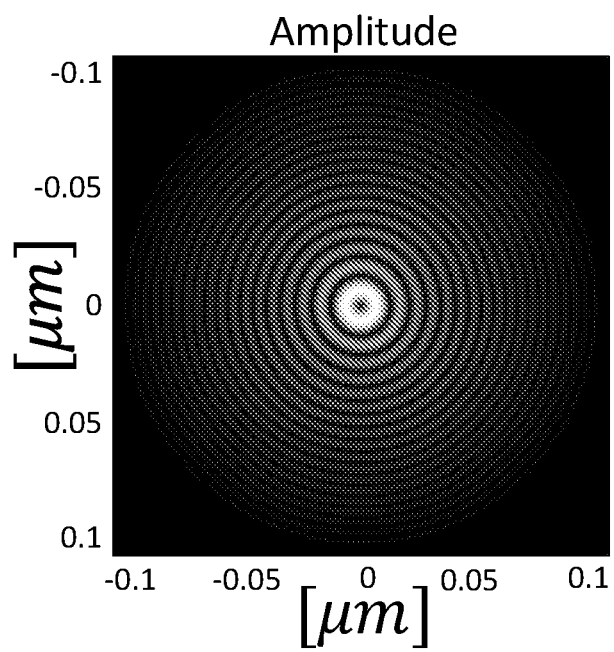
Figure 11D:
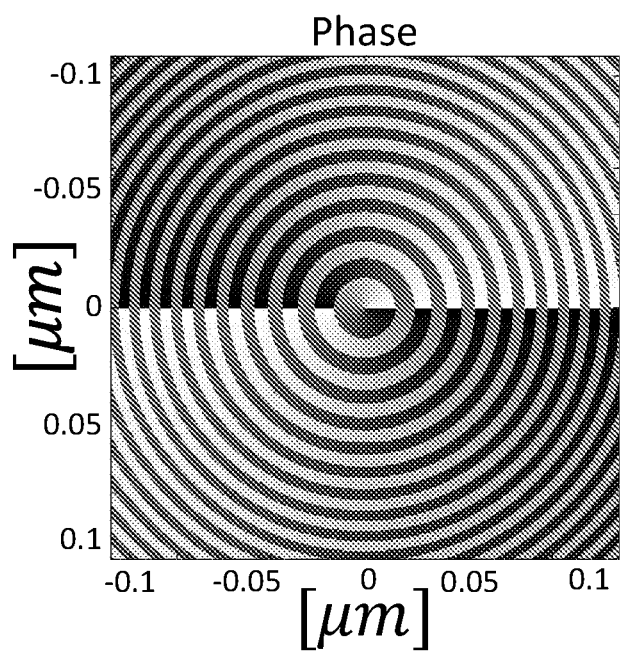

Additional mask configurations are exemplified in FIGS. 10A and 10B showing two examples of binary masks configured for shaping an electron beam to generate MENL wavefunction in accordance of the present invention. FIG. 10A shows a binary mask for generating an electron beam having zero orbital angular momentum and FIG. 10B shows a binary mask configured for generating electron beam having orbital angular momentum of 1. These binary masks are configured to generate the desired MENL wavefunction at the zero order of diffraction, thus increasing electron beam intensity (current), typically at a price of increasing noise. Similarly, the masks may be configured from a plate carrying spaced apart transmitting regions surrounded by blocking regions as exemplified in FIGS. 10A and 10B. In this connection it should be noted that the technique of the present invention may be used to provide beam shaping unit, and/or mask, configured as a binary transmission mask, being relatively simple in construction and operation over various other technologies using holographic techniques. Furthermore, the beam shaping unit and/or mask according to the present invention may be configured to affect phase and/or amplitude of the electron beam, e.g. utilizing a phase mask such as kinoform having a surface relief as well as the use of magnetic arrangement for phase/amplitude variations.

FIGS. 11A to 11D show amplitude and phase maps of the electron beam cross sectional wave-function according to the present invention having zero orbital angular momentum (FIGS. 11A and 11B) and having orbital angular momentum of 1 (FIGS. 11C and 11D) as generated by the masks of FIGS. 10A and 10B. As indicated above, a phase only, amplitude only, or combined mask may be used to generate the desired beam wave-function. A phase only mask is configured in accordance with phase map of the wavefunction, and amplitude portion of the mask (when used) is configured in accordance with amplitude map as shown in FIGS. 11A to 11D.

Typically a kinoform mask may be used to provide the desired phase variation. For example a thin plate of silicon nitride, having pseudo binary surface relief as shown may provide phase variation while keep the probability distribution (amplitude) constant along the cross section in the near field. The desired beam shape will be generated while propagating of the electron beam.

Thus, the present invention provides a technique for designing a mask and beam shaping unit for use in an electron microscope or electron beam column. The mask is configured for generating an electron beam providing non-divergent high resolution multi-electron beam. The technique of the invention relies on the inventors' understanding that such a multi-electron beam needs to be tailored while taking into account the interaction between electrons. The beam shaping according to the present invention compensates for both space charge effects and diffraction, affecting the wave-function of the electron beam. The technique of the invention may be applied in various different applications in electron microscopy, lithography, accelerators and many more.

The invention claimed is:

1. An electron beam shaping unit for use in electron beam column, the electron beam shaping unit is configured for affecting multi electron wave function and comprising a mask unit configured for affecting propagation of electrons therethrough to thereby form at far field thereof a propagating electron beam having radial shape as determined by MENL function being an eigen function determined by a multi-electron Hartree-Fock Hamiltonian.

2. The electron beam shaping unit of claim 1, wherein the mask is configured as a binary mask having a plurality of spaced apart transmitting and blocking regions.

3. The electron beam shaping unit of claim 1, wherein the mask is configured as a phase and amplitude mask having a kinoform surface relief configuration.

4. The electron beam shaping unit of claim 1, wherein the mask is configured to direct the electron beam having MENL wavefunction to a zero or first diffraction order.

5. The electron beam shaping unit of claim 1, wherein the mask is configured to generate electron beam having MENL wavefunction having zero or integer value of orbital angular momentum.

6. The electron beam shaping unit of claim 1, wherein said MENL wavefunction corresponds to a solution of:

$$E\psi(r,t) = -\frac{\hbar^2}{2m}\nabla^2\psi(r,t) + \frac{\sigma Ne^2}{4\pi\varepsilon_0}\left(\int \frac{|\psi(r',t)|^2}{|r-r'|}d^3r'\right)\psi(r,t)$$

where ψ(r,t) is the MENL wavefunction, E being energy eigenvalue of the wavefunction, $\hbar$ is Planck constant divided by $2\pi$, m is electron mass, $\varepsilon_0$ is dielectric constant of vacuum, e is electron charge, N is number of electrons in the beam, and σ is the ratio of electrons having the same spin states.

7. A method for use in design of an electron beam column, the method comprising: providing data about desired electron beam parameters; determining corresponding parameters for a multi-electron Hamiltonian; determining an eigen function of said multi-electron Hamiltonian corresponding to the desired electron beam parameters; determining a transmission function providing said eigen function and determining structure of a mask having said transmission function when transmitting plane wave electron beam therethrough.

8. The method of claim 7, wherein said multi-electron Hamiltonian being a Hrtree-Fock Hamiltonian.

9. The method of claim 7, wherein said desired electron beam parameters comprise data about electron beam energy and electron density within the beam.

10. The method of claim 7, wherein said desired electron beam parameters comprise data about acceleration voltage of the electrons and data about current on the electron beam column.

11. The method of claim 7, wherein said determining an eigen function comprises determining an MENL wave function having desired parameters in accordance with said electron beam parameters.

12. The method of claim 11, wherein said desired parameters comprise orbital angular momentum value and data about energy of the electron beam.

13. The method of claim 7, wherein said determining a transmission function comprises determining a Fourier transform of the desire wavefunction.

14. The method of claim 13, wherein said determining a transmission function further comprises providing data about hologram plane wave to thereby direct the electron beam to the desire direction.

15. The method of claim 7, wherein said determining structure of a mask comprises thresholding of said transmission function in accordance with a predetermined threshold value such that where the transmission function value exceeds the threshold said mask having full transmission and where the transmission function is below the threshold the mask is configured for blocking transmission.

16. An electron beam shaping unit for use in electron beam column, the beam shaping unit being characterized in the following:
  (a) said electron beam shaping unit being configured for affecting electron wave function passing; and
  (b) said electron beam shaping unit being configured to affect said electron wave function passing therethrough to form a substantially not diverging multi-electron wave function.

17. The electron beam shaping unit of claim 16, comprising at least one mask configured as a binary mask and having a plurality of spaced apart transmitting and blocking regions arranged in accordance with one or more MENL functions being an eigen function determined by a multi-electron Hartree-Fock Hamiltonian.

18. The electron beam shaping unit of claim 17, wherein the mask is configured as a phase and amplitude mask having a kinoform surface relief configuration.

19. The electron beam shaping unit of claim 17, wherein the mask is configured to direct the electron beam having MENL wavefunction to a zero or first diffraction order.

20. The electron beam shaping unit of claim 17, wherein the mask is configured to generate electron beam having MENL wavefunction having zero or integer value of orbital angular momentum.

21. The electron beam shaping unit of claim 17, wherein said MENL wavefunction corresponds to a solution of:

$$E\psi(r, t) = -\frac{\hbar^2}{2m}\nabla^2 \psi(r, t) + \frac{\sigma N e^2}{4\pi\varepsilon_0}\left(\int \frac{|\psi(r', t)|^2}{|r - r'|} d^3 r'\right)\psi(r, t)$$

where $\psi(r,t)$ is the MENL wavefunction, E being energy eigenvalue of the wavefunction, $\hbar$ is Planck constant divided by $2\pi$, m is electron mass, $\varepsilon_0$ is dielectric constant of vacuum, e is electron charge, N is number of electrons in the beam, and $\sigma$ is the ratio of electrons having the same spin states.

* * * * *